US010555076B1

(12) United States Patent
Valeri et al.

(10) Patent No.: US 10,555,076 B1
(45) Date of Patent: Feb. 4, 2020

(54) POP AND BURBLE CONDITION DETECTION AND CALIBRATION MODIFICATION

(71) Applicant: GM GLOBAL TECHNOLOGY OPERATIONS LLC, Detroit, MI (US)

(72) Inventors: Frank C. Valeri, Novi, MI (US); William Seldon, Highland, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 16/138,421

(22) Filed: Sep. 21, 2018

(51) Int. Cl.

| | |
|---|---|
| ***H04B 1/00*** | (2006.01) |
| ***H03G 3/00*** | (2006.01) |
| ***H04R 3/00*** | (2006.01) |
| ***G07C 5/08*** | (2006.01) |

(52) U.S. Cl.
CPC ............. *H04R 3/00* (2013.01); *G07C 5/0833* (2013.01); *H04R 2499/13* (2013.01)

(58) Field of Classification Search
CPC ........ H04R 3/00; H04R 3/04; H04R 2499/13; G07C 5/0833; B60R 11/0217
USPC .................................. 381/61, 86, 71.4, 73.1
See application file for complete search history.

(56) References Cited

U.S. PATENT DOCUMENTS 5,371,802 A * 12/1994 McDonald ............. G10K 15/02 381/110
5,635,903 A * 6/1997 Koike .................... A63H 17/34 340/384.1
8,730,020 B2 * 5/2014 Konet .................... G10K 15/02 340/384.1
8,938,079 B2 * 1/2015 Valeri .................... G10K 15/02 340/384.3
9,227,566 B2 * 1/2016 Valeri .................... B60Q 5/005
9,271,073 B2 2/2016 Valeri et al.
9,365,158 B2 * 6/2016 Barlow, Jr. .............. B60Q 9/00
9,793,870 B1 * 10/2017 Valeri ...................... H03G 3/30
10,071,686 B2 * 9/2018 Reilly .................... B60Q 5/005
10,140,970 B1 * 11/2018 Valeri .................... B60Q 5/008
2007/0234879 A1 * 10/2007 Kobayashi ............... G10H 1/14 84/600
2011/0010269 A1 * 1/2011 Ballard .................. B60Q 5/008 705/26.41
2015/0016627 A1 1/2015 Barlow, Jr. et al.
2017/0078822 A1 3/2017 Barlow, Jr. et al.
2017/0337915 A1 11/2017 Valeri et al.

* cited by examiner

*Primary Examiner* — Xu Mei
(74) *Attorney, Agent, or Firm* — Cantor Colburn LLP

(57) ABSTRACT

A method of controlling audio within a vehicle. The method includes determining a selectable driving mode, ascertaining an operating state of an engine in the vehicle, and identifying at least one of an engine start status and a drivetrain status of the vehicle. In response to at least one of the determining, ascertaining, and identifying, selecting a predetermined sound to be output within a passenger cabin of the vehicle; and applying a signal to a speaker of the passenger cabin of the vehicle based on the predetermined sound.

20 Claims, 5 Drawing Sheets

POP AND BURBLE CONDITION DETECTION AND CALIBRATION MODIFICATION

INTRODUCTION

The present disclosure relates to vehicle audio systems and methods and, more particularly, to audio control systems and methods for producing sounds that are naturally produced by an engine of the vehicle but may not be heard within a passenger cabin of the vehicle.

Some motor vehicles include conventional powertrains having an internal combustion engine and a drivetrain that normally emit sounds during acceleration events, deceleration events, and gear changes. Many consumers have come to rely on and appreciate these normal sounds as a sign of proper vehicle function. Changes in these normal sounds may indicate, to certain consumers, that the internal combustion engine and/or the drivetrain may be functioning differently than expected.

Some consumers may have expectations as to what the normal sounds of different types of vehicle should be. For example, a consumer may expect certain sounds from "high performance" vehicles, while some sounds may not be expected from other types of vehicles. An absence of expected sounds may detract from a user's enjoyment of a vehicle.

Some motor vehicles include hybrid electric powertrains including an internal combustion engine and one or more electric motors and/or motor generator units (MGUs). Sound produced by hybrid electric powertrains may be different than the sound produced by conventional powertrains.

SUMMARY

In one exemplary embodiment disclosed herein is a method of controlling audio within a vehicle. The method includes determining a selectable driving mode, ascertaining an operating state of an engine in the vehicle, and identifying a drivetrain status of the vehicle. In response to at least one of the determining, ascertaining, and identifying, selecting a predetermined sound to be output within a passenger cabin of the vehicle, and applying a signal to a speaker of the passenger cabin of the vehicle based on the predetermined sound.

In addition to one or more of the features described above, or as an alternative, further embodiments may include that the predetermined sound is at least one of a start-up flare and a neutral free rev.

In addition to one or more of the features described above, or as an alternative, further embodiments may include that the predetermined sound is the start-up flare if the auto start status is key start and the predetermined sound is the neutral free rev if the drive train status in park/neutral.

In addition to one or more of the features described above, or as an alternative, further embodiments may include that determining at least one of: whether a vehicle speed exceeds a selected vehicle speed threshold and whether an engine speed is within at least one of a selected upper engine speed range and a selected first or second lower engine speed range, ascertaining a direction of shifting of a transmission in the vehicle, in response to at least one of the determining and ascertaining, selecting a predetermined sound to be output within a passenger cabin of the vehicle, and applying a signal to a speaker of the passenger cabin of the vehicle based on the predetermined sound.

In addition to one or more of the features described above, or as an alternative, further embodiments may include that if the engine speed is in the selected upper engine speed range, and, if the direction of shift is an up shift, then the predetermined sound is a fuel cut on wide open throttle, otherwise, if the direction of shift is ascertained to be no shift, then the predetermined sound is a closed throttle deceleration in fixed gear, otherwise, if the direction of shift is a down shift, then no predetermined sound is played.

In addition to one or more of the features described above, or as an alternative, further embodiments may include that if the engine speed is in the first selected lower engine speed range, and, if the direction of shift is an down shift, then the predetermined sound is a rev match down shift, otherwise, is the direction of shift is ascertained to be no shift, then the predetermined sound is a closed throttle deceleration for a selected speed range, otherwise, if the direction of shift is up shift, then no predetermined sound is played.

In addition to one or more of the features described above, or as an alternative, further embodiments may include that if the engine speed is in the selected upper engine speed range and it is determined that the driver input to the accelerator pedal exceeds about a selected threshold, and if it is determined that the direction of shift is ascertained to be an upshift, then the predetermined sound is a fuel cut on wide open throttle shift points for the upper selected speed range, otherwise, if it is determined that the direction of shift is ascertained to be an no shift, then the predetermined sound is a closed throttle deceleration in fixed gear for manual transmission, otherwise, if it is determined that the driver is not applying input to an accelerator pedal or the direction of shift is ascertained to be a downshift, then no predetermined sound is played.

In addition to one or more of the features described above, or as an alternative, further embodiments may include that if the engine speed is in the second selected lower engine speed range, then no predetermined sound is played.

In addition to one or more of the features described above, or as an alternative, further embodiments may include that the selected vehicle speed threshold is thirty miles per hour.

In addition to one or more of the features described above, or as an alternative, further embodiments may include that the upper selected engine speed range is about 4500-9000 rpm, the first lower selected engine speed range is about 3000-4500 rpm, and the second lower selected engine speed range is about 1500-3000 rpm.

In addition to one or more of the features described above, or as an alternative, further embodiments may include classifying a type of the sound as one of, a first type of the sound, and a second type of the sound, selecting a first predetermined sound as the predetermined sound when the type of the sound is the first type of the sound, and selecting a second predetermined sound as the predetermined sound when the type of the sound is the second type of the sound.

In addition to one or more of the features described above, or as an alternative, further embodiments may include that the classifying includes classifying the sound is based on at least one of the pressure measured by the exhaust pressure sensor, a rate of increase (ROI) of the pressure measured by the exhaust pressure sensor, the duration of a pop. Average pop loudness, and average pop duration, normal level burbles and mild level burbles.

Also described herein in an embodiment an audio system of a vehicle having an engine and a drive train. The system including determining a selectable driving mode, ascertain an operating state of an engine in the vehicle, identify least one of an auto start status and a drivetrain status of the vehicle, in response to the determining, ascertaining, and identifying, select a predetermined sound based on at least one of a pop and a burble, to be output within a passenger cabin of the vehicle, and apply a signal to a speaker of the passenger cabin of the vehicle based on the predetermined sound.

In addition to one or more of the features described above, or as an alternative, further embodiments may include that the predetermined sound is at least one of a start-up flare and a neutral free rev.

In addition to one or more of the features described above, or as an alternative, further embodiments may include that the predetermined sound is the start-up flare if the auto start status is key start and the predetermined sound is the neutral free rev if the drive train status in park/neutral.

In addition to one or more of the features described above, or as an alternative, further embodiments may include that the audio controller configured to determine at least one of, whether a vehicle speed exceeds a selected vehicle speed threshold and whether an engine speed is within at least one of a selected upper engine speed range and a selected first or second lower engine speed range, ascertain a direction of shifting of a transmission in the vehicle, in response to at least one of the determining and ascertaining, select a predetermined sound to be output within a passenger cabin of the vehicle, and apply a signal to a speaker of the passenger cabin of the vehicle based on the predetermined sound.

In addition to one or more of the features described above, or as an alternative, further embodiments may include that if the engine speed is in the selected upper engine speed range, and if the direction of shift is an up shift, then the predetermined sound is a fuel cut on wide open throttle, otherwise, is the direction of shift is ascertained to be no shift, then the predetermined sound is a closed throttle deceleration in fixed gear, otherwise if the direction of shift is a down shift, then no predetermined sound is played.

In addition to one or more of the features described above, or as an alternative, further embodiments may include that if the engine speed is in the first selected lower engine speed range, and if the direction of shift is an down shift, then the predetermined sound is a rev match down shift, otherwise if the direction of shift is ascertained to be no shift, then the predetermined sound is a closed throttle deceleration for a selected speed range, otherwise if the direction of shift is up shift, then no predetermined sound is played.

In addition to one or more of the features described above, or as an alternative, further embodiments may include that if the engine speed is in the selected upper engine speed range and it is determined that the driver input to the accelerator pedal exceeds about a selected threshold, and if it is determined that the direction of shift is ascertained to be an upshift, then the predetermined sound is a fuel cut on wide open throttle shift points for the upper selected speed range, otherwise, if it is determined that the direction of shift is ascertained to be an no shift, then the predetermined sound is a closed throttle deceleration in fixed gear for manual transmission, otherwise if it is determined that the driver is not applying input to an accelerator pedal or the direction of shift is ascertained to be a downshift, then no predetermined sound is played.

In addition to one or more of the features described above, or as an alternative, further embodiments may include that if the engine speed is in the second selected lower engine speed range, then no predetermined sound is played.

In addition to one or more of the features described above, or as an alternative, further embodiments may include that the selected vehicle speed threshold is thirty miles per hour.

In addition to one or more of the features described above, or as an alternative, further embodiments may include that the upper selected engine speed range is about 4500-9000 rpm, the first lower selected engine speed range is about 3000-4500 rpm, and the second lower selected engine speed range is about 1500-3000 rpm.

In addition to one or more of the features described above, or as an alternative, further embodiments may include that the audio controller configured to classify a type of the sound as one of a first type of the sound, and a second type of the sound, select a first predetermined sound as the predetermined sound when the type of the sound is the first type of the sound, and select a second predetermined sound as the predetermined sound when the type of the sound is the second type of the sound.

In addition to one or more of the features described above, or as an alternative, further embodiments may include that the classifying is based on at least one of the pressure measured by the exhaust pressure sensor, a rate of increase (ROI) of the pressure measured by the exhaust pressure sensor, the duration of a pop. average pop loudness, and average pop duration, normal level burbles and mild level burbles.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
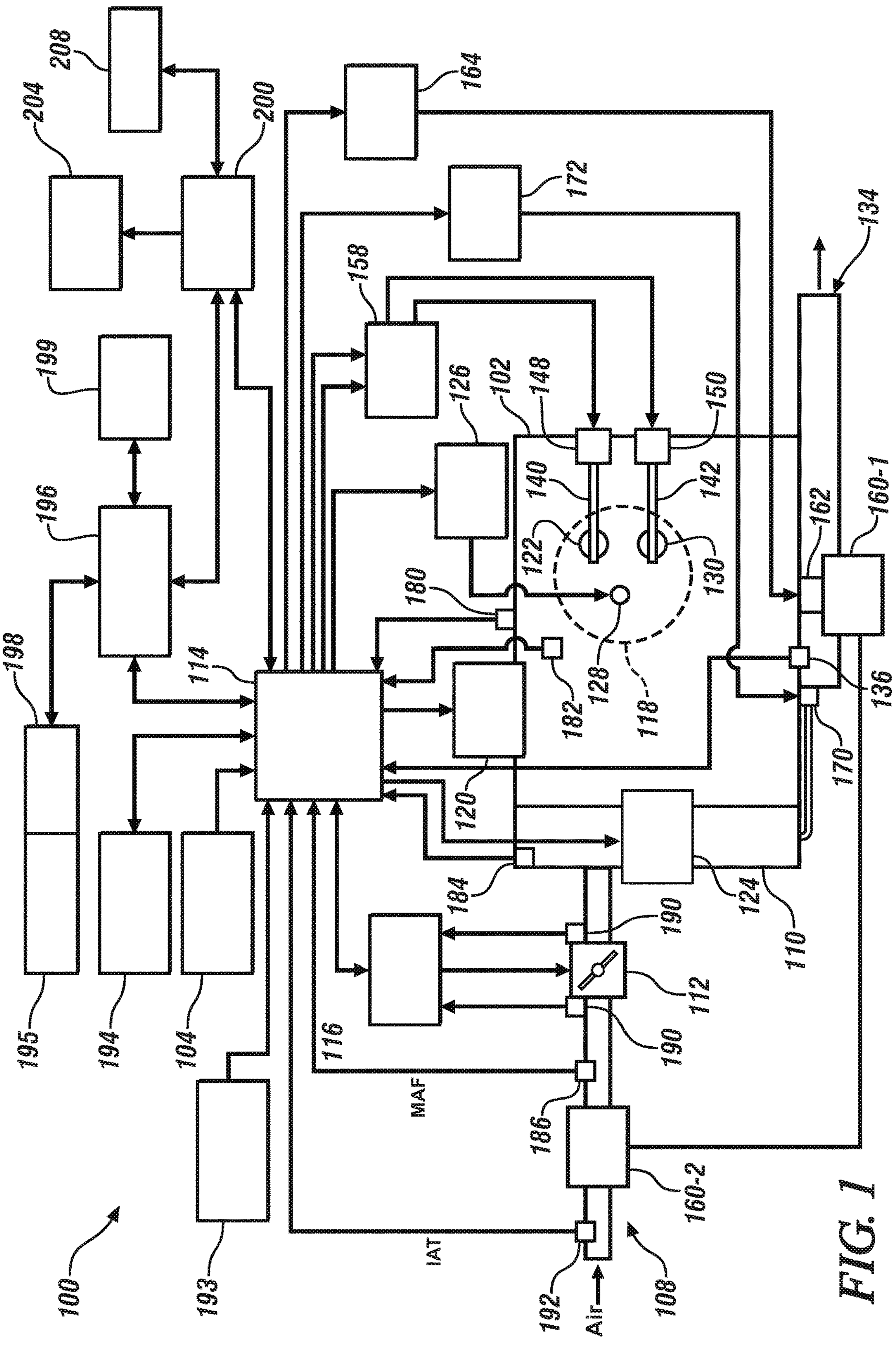
FIG. 1 is a functional block diagram of a vehicle system in accordance with an embodiment.

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

Internal combustion engines of vehicles combust air and fuel within cylinders. During vehicle deceleration at positive vehicle speeds, the engine may emit natural sounds, such as pop sounds and burble sounds when fuel combusts within an exhaust system of the vehicle. Some vehicles, such as performance luxury vehicles, may include one or more sound damping devices that attenuate or minimize the sound of the natural pops and burbles heard within a passenger cabin of the vehicle.

According to the present disclosure, an audio control module of the vehicle outputs sound within the passenger cabin via one or more speakers, such as during a deceleration event, to replicate and enhance the natural pop and burble sounds of the vehicle. The audio control module identifies conditions associated with the presence of pops and burble and generates predetermined sound enhancements within the passenger cabin. This added sound aurally provides the driver with improvements to the natural pop sounds produced by the engine and may increase the aural experience of the driver. The predetermined pop and burble sounds may be stored in memory (e.g., small .Wav files or other types of sound files). Using a variety of methodologies to formulate a predetermined set of sounds, a particular predetermined sounds file may be generated to correspond to a particular vehicle condition. Techniques such as granular synthesis, randomization equations, waveform generation and filtering in order to slice up the .wav files into millisecond sections and tie each slice to instantaneous values of occurrences of events in the vehicle (e.g., vehicle speed/engine RPM, etc.) in order to adjust the output level, pitch, etc. in order to create very natural sounding pops and burbles through the speakers that never repeat in pattern Referring now to FIG. 1, a functional block diagram of an example vehicle system 100 is presented. A vehicle includes an engine 102 that combusts an air/fuel mixture to produce torque. The vehicle may be non-autonomous, semi-autonomous, or autonomous.

Air is drawn into the engine 102 through an intake system 108. The intake system 108 may include an intake manifold 110 and a throttle valve 112. For example only, the throttle valve 112 may include a butterfly valve having a rotatable blade. An engine control module (ECM) 114 controls a throttle actuator module 116, and the throttle actuator module 116 regulates opening of the throttle valve 112 to control airflow into the intake manifold 110.

Air from the intake manifold 110 is drawn into cylinders of the engine 102. While the engine 102 includes multiple cylinders, for illustration purposes a single representative cylinder 118 is shown. For example only, the engine 102 may include 2, 3, 4, 5, 6, 8, 10, and/or 12 cylinders. The ECM 114 may instruct a cylinder actuator module 120 to selectively deactivate some of the cylinders under some circumstances, as discussed further below, which may improve fuel efficiency.

The engine 102 may operate using a four-stroke cycle or another suitable engine cycle. The four strokes of a four-stroke cycle, described below, will be referred to as the intake stroke, the compression stroke, the combustion stroke, and the exhaust stroke. During each revolution of a crankshaft (not shown), two of the four strokes occur within the cylinder 118. Therefore, two crankshaft revolutions are necessary for the cylinder 118 to experience all four of the strokes. For four-stroke engines, one engine cycle may correspond to two crankshaft revolutions.

When the cylinder 118 is activated, air from the intake manifold 110 is drawn into the cylinder 118 through an intake valve 122 during the intake stroke. The ECM 114 controls a fuel actuator module 124, which regulates fuel injection to achieve a desired air/fuel ratio. Fuel may be injected into the intake manifold 110 at a central location or at multiple locations, such as near the intake valve 122 of each of the cylinders. In various implementations (not shown), fuel may be injected directly into the cylinders or into mixing chambers/ports associated with the cylinders. The fuel actuator module 124 may halt injection of fuel to cylinders that are deactivated.

The injected fuel mixes with air and creates an air/fuel mixture in the cylinder 118. During the compression stroke, a piston (not shown) within the cylinder 118 compresses the air/fuel mixture. The engine 102 may be a compression-ignition engine, in which case compression causes ignition of the air/fuel mixture. Alternatively, the engine 102 may be a spark-ignition engine, in which case a spark actuator module 126 energizes a spark plug 128 in the cylinder 118 based on a signal from the ECM 114, which ignites the air/fuel mixture. Some types of engines, such as homogenous charge compression ignition (HCCI) engines may perform both compression ignition and spark ignition. The timing of the spark may be specified relative to the time when the piston is at its topmost position, which will be referred to as top dead center (TDC).

The spark actuator module 126 may be controlled by a timing signal specifying how far before or after TDC to generate the spark. Because piston position is directly related to crankshaft rotation, operation of the spark actuator module 126 may be synchronized with the position of the crankshaft. The spark actuator module 126 may disable provision of spark to deactivated cylinders or provide spark to deactivated cylinders.

During the combustion stroke, the combustion and rapid expansion of the air/fuel mixture drives the piston down, thereby driving the crankshaft. The combustion stroke may be defined as the time between the piston reaching TDC and the time when the piston returns to a bottom most position, which will be referred to as bottom dead center (BDC).

Finally, during the exhaust stroke, the piston begins moving up from BDC and expels the byproducts of combustion through an exhaust valve 130. The byproducts of combustion are exhausted from the vehicle via an exhaust system. In some systems, an exhaust pressure sensor 136 measures an exhaust pressure within the exhaust system 134. For example, the exhaust pressure sensor 136 may measure the exhaust pressure within an exhaust manifold, in an exhaust conduit near the exhaust manifold, or in another location in the exhaust system 134.

The intake valve 122 may be controlled by an intake camshaft 140, while the exhaust valve 130 may be controlled by an exhaust camshaft 142. In various implementations, multiple intake camshafts (including the intake camshaft 140) may control multiple intake valves (including the intake valve 122) for the cylinder 118 and/or may control the intake valves (including the intake valve 122) of multiple banks of cylinders (including the cylinder 118). Similarly, multiple exhaust camshafts (including the exhaust camshaft 142) may control multiple exhaust valves for the cylinder 118 and/or may control exhaust valves (including the exhaust valve 130) for multiple banks of cylinders (including the cylinder 118). While camshaft based valve actuation is shown and has been discussed, camless valve actuators may also be implemented. While separate intake and exhaust camshafts 140, 142 are shown, one camshaft having lobes for both the intake and exhaust valves 122, 130 may be used.

The cylinder actuator module 120 may deactivate the cylinder 118 by disabling opening of the intake valve 122 and/or the exhaust valve 130. The time when the intake valve 122 is opened may be varied with respect to piston TDC by an intake cam phaser 148. The time when the exhaust valve 130 is opened may be varied with respect to piston TDC by an exhaust cam phaser 150. A phaser actuator module 158 may control the intake cam phaser 148 and the exhaust cam phaser 150 based on signals from the ECM 114. In various implementations, cam phasing may be omitted. Variable valve lift (not shown) may also be controlled by the phaser actuator module 158. In various other implementations, the intake valve 122 and/or the exhaust valve 130 may be controlled by actuators other than a camshaft, such as electromechanical actuators, electrohydraulic actuators, electromagnetic actuators, and the like.

The engine 102 may include zero, one, or more than one boost device that provides pressurized air to the intake manifold 110. For example, FIG. 1 shows a turbocharger including a turbocharger turbine 160-1 that is driven by exhaust gases flowing through the exhaust system 134. A supercharger is another type of boost device.

The turbocharger also includes a turbocharger compressor 160-2 that is driven by the turbocharger turbine 160-1 and that compresses air leading into the throttle valve 112. A wastegate 162 controls exhaust flow through the turbocharger turbine 160-1. Wastegates can also be referred to as (turbocharger) turbine bypass valves. The wastegate 162 may allow exhaust to bypass the turbocharger turbine 160-1 to reduce intake air compression provided by the turbocharger. The ECM 114 may control the turbocharger via a wastegate actuator module 164. The wastegate actuator module 164 may modulate the boost of the turbocharger by controlling an opening of the wastegate 162.

A cooler (e.g., a charge air cooler or an intercooler) may dissipate some of the heat contained in the compressed air charge, which may be generated as the air is compressed. Although shown separated for purposes of illustration, the turbocharger turbine 160-1 and the turbocharger compressor 160-2 may be mechanically linked to each other, placing intake air in close proximity to hot exhaust gas. The compressed air charge may absorb heat from components of the exhaust system 134.

The engine 102 may include an exhaust gas recirculation (EGR) valve 170, which selectively redirects exhaust gas back to the intake manifold 110. The EGR valve 170 may receive exhaust gas from upstream of the turbocharger turbine 160-1 in the exhaust system 134. The EGR valve 170 may be controlled by an EGR actuator module 172.

Crankshaft position may be measured using a crankshaft position sensor 180. An engine speed may be determined based on the crankshaft position measured using the crankshaft position sensor 180. A temperature of engine coolant may be measured using an engine coolant temperature (ECT) sensor 182. The ECT sensor 182 may be located within the engine 102 or at other locations where the coolant is circulated, such as a radiator (not shown).

A pressure within the intake manifold 110 may be measured using a manifold absolute pressure (MAP) sensor 184. In various implementations, engine vacuum, which is the difference between ambient air pressure and the pressure within the intake manifold 110, may be measured. A mass flow rate of air flowing into the intake manifold 110 may be measured using a mass air flow (MAF) sensor 186. In various implementations, the MAF sensor 186 may be located in a housing that also includes the throttle valve 112.

Position of the throttle valve 112 may be measured using one or more throttle position sensors (TPS) 190. A temperature of air being drawn into the engine 102 may be measured using an intake air temperature (IAT) sensor 192. One or more other sensors 193 may also be implemented. The other sensors 193 may include an accelerator pedal position (APP) sensor, a brake pedal position (BPP) sensor, may include a clutch pedal position (CPP) sensor (e.g., in the case of a manual transmission), and may include one or more other types of sensors. An APP sensor measures a position of an accelerator pedal within a passenger cabin of the vehicle. A BPP sensor measures a position of a brake pedal within a passenger cabin of the vehicle. A CPP sensor may measure a position of a clutch pedal within the passenger cabin of the vehicle. The other sensors 193 may also include one or more acceleration sensors that measure longitudinal (e.g., fore/aft) acceleration of the vehicle and latitudinal acceleration of the vehicle. An accelerometer is an example type of acceleration sensor, although other types of acceleration sensors may be used. The ECM 114 may use signals from the sensors to make control decisions for the engine 102.

The ECM 114 may communicate with a transmission control module 194, for example, to coordinate engine operation with gear shifts in a transmission 195. The ECM 114 may communicate with a hybrid control module 196, for example, to coordinate operation of the engine 102 and a motor generator unit (MGU) 198. While the example of one MGU 198 is provided, multiple MGUs and/or electric motors may be implemented. The terms MGU and electric motor may be interchangeable in the context of the present application, drawings, and claims. In various implementations, various functions of the ECM 114, the transmission control module 194, and the hybrid control module 196 may be integrated into one or more modules.

Each system that varies an engine parameter may be referred to as an engine actuator. Each engine actuator has an associated actuator value. For example, the throttle actuator module 116 may be referred to as an engine actuator, and the throttle opening area may be referred to as the actuator value. In the example of FIG. 1, the throttle actuator module 116 achieves the throttle opening area by adjusting an angle of the blade of the throttle valve 112. Likewise the spark actuator module 126 may also be referred to as an engine actuator, having a corresponding actuator value corresponding to the amount of spark advance, for example, relative to cylinder TDC. Other engine actuators may include the cylinder actuator module 120, the fuel actuator module 124, the phaser actuator module 158, the wastegate actuator module 164, and the EGR actuator module 172. For these engine actuators, the actuator values may correspond to a cylinder activation/deactivation sequence, fueling rate, intake and exhaust cam phaser angles, target wastegate opening, and EGR valve opening, respectively.

The ECM 114 may control the actuator values in order to cause the engine 102 to output torque based on a torque request. The ECM 114 may determine the torque request, for example, based on one or more driver inputs from driver input module 104, such as, but not limited to mode selections 33, and/or one or more other suitable driver inputs. The ECM 114 may determine the torque request, for example, using one or more functions or lookup tables that relate the driver input(s) to torque requests.

Under some circumstances, the hybrid control module 196 controls the MGU 198 to output torque, for example, to supplement engine torque output. The hybrid control module 196 may also control the MGU 198 to output torque for vehicle propulsion at times when the engine 102 is shut down.

The hybrid control module 196 applies electrical power from a battery 199 to the MGU 198 to cause the MGU 198 to output positive torque. While the example of the battery 199 is provided, more than one battery may be used to supply power to the MGU 198. The MGU 198 may output torque, for example, to the engine 102, to an input shaft of the transmission 195, to an output shaft of the transmission 195, or to another torque transfer device of the powertrain of the vehicle. The battery 199 may be dedicated for the MGU 198 and one or more other batteries may supply power for other vehicle functions.

Under other circumstances, the hybrid control module 196 may control the MGU 198 to convert mechanical energy of the vehicle into electrical energy. The hybrid control module 196 may control the MGU 198 to convert mechanical energy into electrical energy, for example, to recharge the battery 199. This may be referred to as regeneration.

The vehicle system 100 also includes an audio control module 200 that controls sound output via one or more speakers 204 within the passenger cabin of the vehicle. The audio control module 200 may control the speakers 204 to output sound based on received amplitude modulation (AM) signals, received frequency modulation (FM) signals, received satellite signals, and other types of audio signals. The audio control module 200 may be implemented, for example, with an infotainment system.

Under some circumstances, such as during acceleration or deceleration, the audio control module 200 additionally or alternatively controls the sound output via the speakers 204. As discussed above, some vehicles may include one or more sound damping devices that attenuate or eliminate natural sounds (e.g., popping and/or burbling) of the engine 102 that a driver may expect during acceleration or deceleration. The audio control module 200 may control sound output via the speakers 204 in the cabin of the vehicle to replicate some of the normal sounds that the driver may expect.

The audio control module 200 may receive parameters from the ECM 114, the hybrid control module 196, the transmission control module 194, and/or one or more other control modules of the vehicle system 100. The audio control module 200 may receive parameters from other modules via a network, such as a controller area network (CAN) bus or another suitable type of network. In vehicles, CAN may also stand for car area network.

The engine 102 may naturally produce pop and burble sounds when various driving events are occurring, for example deceleration. A pop sound corresponds to exhaust pressure pulses/impulses resulting from combustion of fuel within the exhaust system 134, commonly during deceleration. Burble is the low level continuous murmuring produced by the engine 102 as its running under selected conditions. As discussed above, the pop and burble sounds may not be heard, or may be heard to a lesser extent, within the passenger cabin of the vehicle due to the vehicle including one or more sound damping devices that prevent or minimize the pop and burble sounds within the passenger cabin of the vehicle. This may be undesirable as drivers may expect, and even in some conditions favor hearing the pop and burble sounds. As a result, under selected conditions, the audio control module 200 may be configured to provide various sounds to be output via the speakers 204 into the passenger cabin. In an embodiment the sounds may include pop and burble sounds corresponding to the pop and burble sounds that the engine 102 produces.

The engine 102 may also produce pop sounds under other circumstances and driving conditions, (other than deceleration events). For example, the engine 102 may produce pop sounds when the engine 102 is revved, such as while the vehicle is stopped or moving slowly or while the transmission 195 is not imposing a load on the engine 102. Described herein are various conditions and examples for detecting from the operation of the vehicle system 100 when pop and burble sounds should be generated.

The audio control module 200 includes a plurality of modules and processes configured to detect conditions of the vehicle that would exemplify the occurrences of sounds. For example, in one embodiment the audio control module 200 determines when selected sounds are generated by the engine 102, for example, when a pressure as measured by an exhaust pressure sensor 136 in the exhaust system 134 is greater than a predetermined pressure. The audio control module 200 is configured to detect the pressures as well as the baseline sounds in the passenger cabin of the vehicle and increase a magnitude of a predetermined sound to be output within a passenger cabin of the vehicle. An audio driver is configured to apply power to a speaker of the passenger cabin of the vehicle based on the predetermined sound thereby simulating selected sounds in the passenger cabin. Examples of an audio driver and an engine sound production system may be found in U.S. Pat. No. 9,365,158, entitled Engine Sound Enhancement Based On Vehicle Selected Mode, the contents of which are incorporated by reference herein in their entirety.

Figure 2:
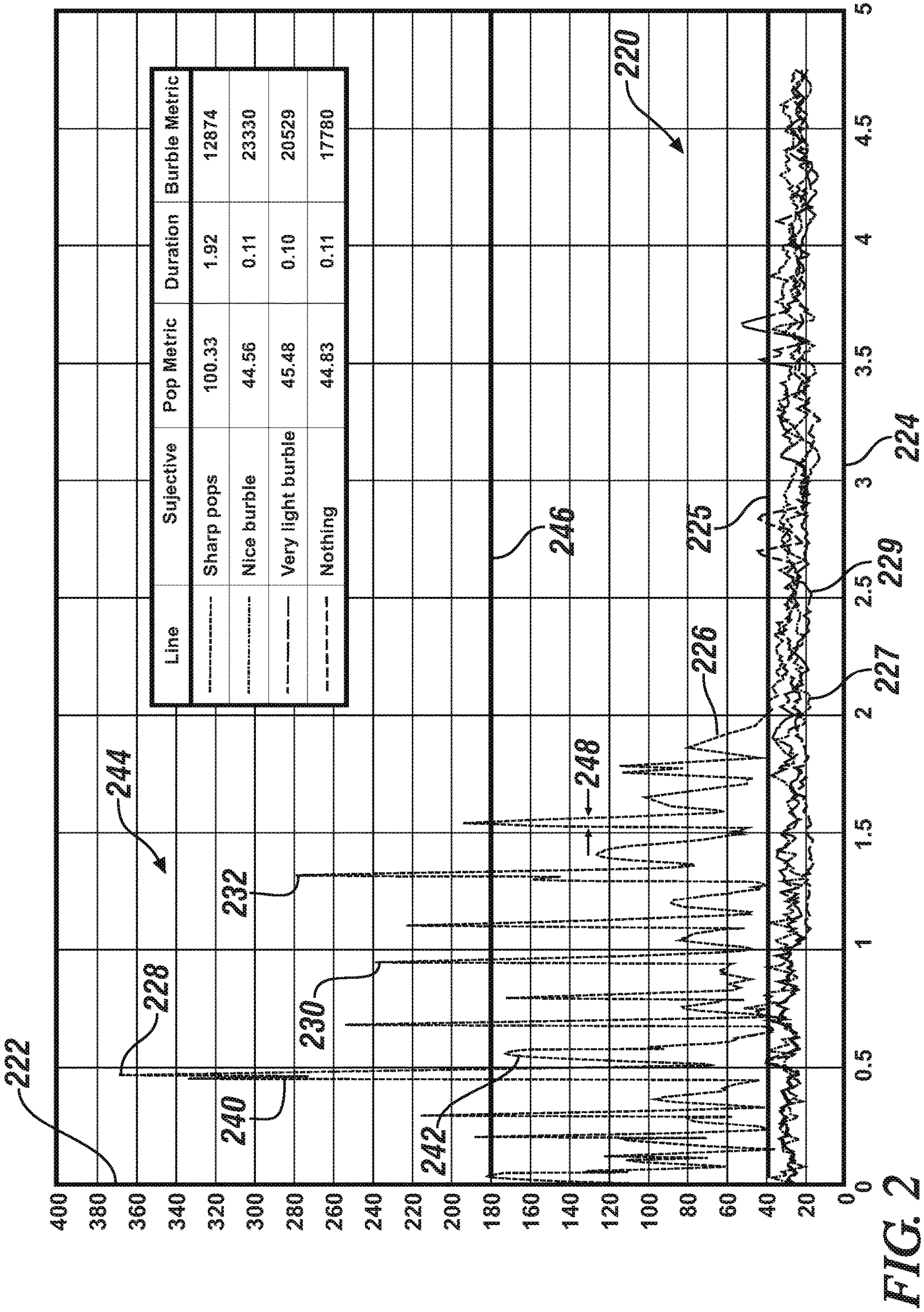
FIG. 2 includes an example time history graph of magnitude of sound and exhaust pressure versus time characterizing pop and burble in accordance with an embodiment.

FIG. 2 depicts an example of a series of time histories of pressure level and the sounds associated with them. The figure depicts a graph 220 of magnitude 222 versus time 224. Trace 226 tracks the exhaust pressure and includes multiple exhaust pressure rises indicative of pops, such as at 228, 230, 232, and others.

The audio control module 200 (FIG. 1) includes a detection function or module (not shown) that determines whether pop and burble are occurring. For example, in an embodiment the detection function may determine that a pop is occurring when the exhaust pressure, as measured by the exhaust pressure sensor 136, is increasing and is greater than a predetermined pressure as depicted by line 225. The detection function may determine that a pop is not occurring when at least one of the exhaust pressure is not increasing and the exhaust pressure is not greater than the predetermined pressure. For example, as depicted, the predetermined pressure is greater than 40 compressed pascals (cp) (cp is a selected measure of sound pressures) and may be calibratable. An example predetermined pressure is illustrated by threshold line 225 in FIG. 2. The audio control module 200 may also include a process to classify various sounds. For example, identifying different types of pops as well as other sounds produced by the engine 102 such as burbles.

Burble is associated the lower level continuous murmuring sounds the engine 102 makes when running. Burble may be identified by counting time steps between peaks in the low pressures between two thresholds. In one embodiment, the pressure pulses are counted for pressures between 20 cp and the 40 cp threshold for pops. Burble is exemplified by line 227 of FIG. 2, while light burble is shown by line 229. When a pop (e.g., 228, 230, 232) is occurring, the classification function may determine a type of the pop shown generally as 244.

In another embodiment, the detection function of the audio control module 200 generates a pop signal that indicates whether a pop is occurring. For example, the detection function may set the pop signal to a first state when a pop is not occurring. The detection function may set the pop signal to a second state when it determines a pop is occurring. In some embodiments, the pop signal may be employed to identify when to generate sounds in the passenger cabin. In other embodiments, the pop signal may identify that the conditions for generating sounds in the vehicle are satisfied. Moreover, different types 244 of pop sounds may exhibit different characteristics, for example, different exhaust pressure characteristics. For example, in one instance different type(s) 244 of pop (e.g., 228, 230, 232) sounds may have a different rate of increase (ROI) of the exhaust pressure. One way of classifying different type(s) 244 of pop (e.g., 228, 230, 232) may be based on the exhaust pressure as measured by the exhaust pressure sensor 136. For example, when a first ROI as depicted by 240 of the exhaust pressure is greater than a first predetermined ROI, that characteristic may be identified as a first predetermined type of pop (e.g., a first state). Impulse (e.g., 228) in FIG. 2 is an example of the first predetermined type of pop (e.g., 228, 230, 232). In another example, when the ROI of the exhaust pressure is less than a second predetermined ROI, a second predetermined type 244 of pop may be established and set (e.g., a second state). Line 242 in FIG. 2 depicts an example of a possible second predetermined type of pop. In the example, the second predetermined ROI is less than the first predetermined ROI. Furthermore, other additional types of pop may be characterized.

In another embodiment, another way to classify pops, (e.g., 228, 230, 232) is described. In an embodiment the durations of the pops as typically generated are summed for the instances that the exhaust pressures, as measured by the exhaust pressure sensor 136, are above a selected threshold (e.g., 225). In addition, in an embodiment, the loudness for the various pops generated above the threshold 225 are averaged. This approach facilitates defining a baseline pop from which adjustments may be made. For example, defining a baseline pop duration and loudness. Line 246 of FIG. 2 depicts an example of an average pop loudness. Likewise, an average duration for a pop may be as depicted by 248. Likewise, as described above, burble may be classified in one or more characterizations, such as normal burble and light burble.

As illustrated in FIG. 2, and described herein various type(s) 244 of pop and burble exhibit/result from unique exhaust pressure characteristics. The audio control module 200 determines a sound to be generated within the passenger cabin for the pop various types 244 of pops (e.g., 228, 230, 232) that are typically occurring. Various characteristics of the pops and burbles include, but are not limited to, the type 244 of the pop, average pop loudness 246, and average duration 248 as well as normal and light for burbles. In an embodiment, the audio control module 200 selectively adjusts the sound that is be played or generating sound within the passenger cabin for the pop and/or burble that is occurring under a predetermined set of conditions in the vehicle system 100.

In an embodiment, an adjustment to the pops and burbles may be based on several factors or modes associated with the vehicle. For example, the adjustments may be made based on a driver selected mode. At a given time, the driver selected mode may be one of, for example, sport, normal, economy, and another mode. The driver selected mode may be set, for example, based on user input to one or more user input devices. The audio control module 200 may provide adjustments in the sounds to be played in the passenger cabin associated with the specific setting of the driver selected mode. In one embodiment, the adjustments and thereby the volume of the sounds played may increase as aggressiveness of the driver selected mode increases and vice versa. For example, the first predetermined value of adjustment (for the sport mode) is greater than the second predetermined value of adjustment (for the normal mode), and the second predetermined value is greater than a third predetermined value (for the economy mode), which may include no adjustment.

Additionally or alternatively to the driver selected mode, the audio control module 200 may determine the adjustments based on a cabin opening. The cabin opening may correspond to an opening of one or more apertures of the passenger cabin of the vehicle. Examples of apertures of the passenger cabin include, for example, windows, openable roofs, convertible tops, removable tops, doors (e.g., side and rear), and foldable rear seats of the vehicle. The cabin opening adjustment may increase/decrease as opening of one or more apertures of the passenger cabin increase and vice versa. As the cabin opening increases, the driver may be more able to hear the natural pop sounds produced by the engine 102 and vice versa. However, the ambient noise levels may also increase. For example, the adjustment may be based on the cabin opening using a lookup table of adjustments indexed by cabin opening. As another example, the adjustment may be set to a first predetermined value when the cabin opening is less than a predetermined value and to a second predetermined value when the cabin opening is greater than the predetermined value. While the example of one predetermined value is discussed, the audio control module 200 may set the adjustment based on the cabin opening relative to a variety of predetermined values.

In an embodiment, an adjustment to the duration of pop and burble enhancement may be based on several factors or modes associated with the vehicle. For example, the adjustments may be made based on a driver selected mode, vehicle speed engine RPM changes, and the like. At a given time, the driver selected mode may be one of, for example, sport, normal, economy, and another mode. The driver selected mode may be set, for example, based on user input to one or more user input devices. The audio control module 200 may provide adjustments in the duration that the sound(s) may be generated for a given set of vehicle conditions. In one embodiment, the adjustments and thereby the duration of generated sound(s) of the may increase as aggressiveness of the driver selected mode increases and vice versa. For example, the first predetermined value of adjustment (for the sport mode) is greater than the second predetermined value of adjustment (for the normal mode), and the second predetermined value is greater than a third predetermined value (for the economy mode), which may include no adjustment. For example, in an embodiment the duration of pops and burbles played in the passenger cabin is dependent on the specific type of vehicle condition detected (e.g., start up flare 330, Fuel cut onWOT shift 350, 470, etc.), (See for example Table 1, FIG. 5). For each type of detected event, a predetermined baseline for the sounds to be played is established. (In one example, a Start-up flare will be generally a few loud pops and maximum level burble as the engine slowly reduces in RPM). In an embodiment, the exact number of pops and burbles will be determined by the instantaneous engine RPM, pedal, Driver's mode, vehicle speed, etc.

Additionally or alternatively to the driver selected mode, the audio control module 200 may determine the adjustments based on vehicle speed, engine RPM and/or a predetermined timer. For example, the adjustment may be based on the Vehicle Speed/Engine RPM using a lookup table of adjustments indexed by threshold. As another example, the adjustment may be set to a first predetermined value when the Vehicle speed/engine RPM are less than a predetermined value and to a second predetermined value when the Vehicle speed/engine RPM is greater than the predetermined value. While the example of one predetermined value is discussed, the audio control module 200 may set the adjustment based on the Vehicle speed/engine RPM relative to a variety of predetermined values.

Additionally or alternatively to the driver selected mode, vehicle speed/engine RPM the audio control module 200 may determine the adjustments based on a predetermined timer. For example, the adjustment may be based a predetermined timer that can be triggered via a specific set of vehicle Speed/engine RPM using a lookup table of adjustments indexed by threshold. As another example, the duration of the timer for generating enhancement may be set to a first predetermined value when the vehicle speed/engine RPM are less than a predetermined value and to a second predetermined value when the vehicle speed/engine RPM is greater than the predetermined value. While the example of one predetermined value is discussed, the audio control module 200 may set the duration adjustment based on the vehicle speed/engine RPM relative to a variety of predetermined values.

The audio control module 200 may also include functions to increase a magnitude of a predetermined pop and burble sound to be output via the speakers 204 according a variety of characteristics as described herein. This is to generate sound within the passenger cabin based on the pop and burble that is typically occurring under selected driving conditions. The audio control module 200 may select the predetermined pop and burble sounds from a group of predetermined pop sounds stored in memory based on the type 244 of the pop, average pop loudness 246, and average duration 248 as well as normal burbles (e.g., 227) and light burbles (e.g., 229). For example, the audio control module 200 selects a first predetermined pop sound when the type 244 is the first type of pop. The audio control module 200 selects a second predetermined pop sound when the type 244 is the second type of pop. The audio control module 200 selects a third predetermined pop sound when the type 244 is the third type of pop. Likewise, the audio control module 200 may select a type of burble to play corresponding to playing normal or light burbles and the like. The audio control module 200 may also generate various characteristics to include one or more other sounds, for example, for sound enhancement, sound masking, etc. Alternatively, the same predetermined pop or burble sound may be used for each of the different types of pop and burble. Outputting pop and burble sounds during various driving events may replicate the pop and burble sounds produced by the engine 102 that the driver may expect to hear during various driving conditions and selected modes, despite the fact that the pop sounds produced by the engine 102 may be attenuated by the passenger cabin. This may increase the driver's aural experience.

Figure 3:
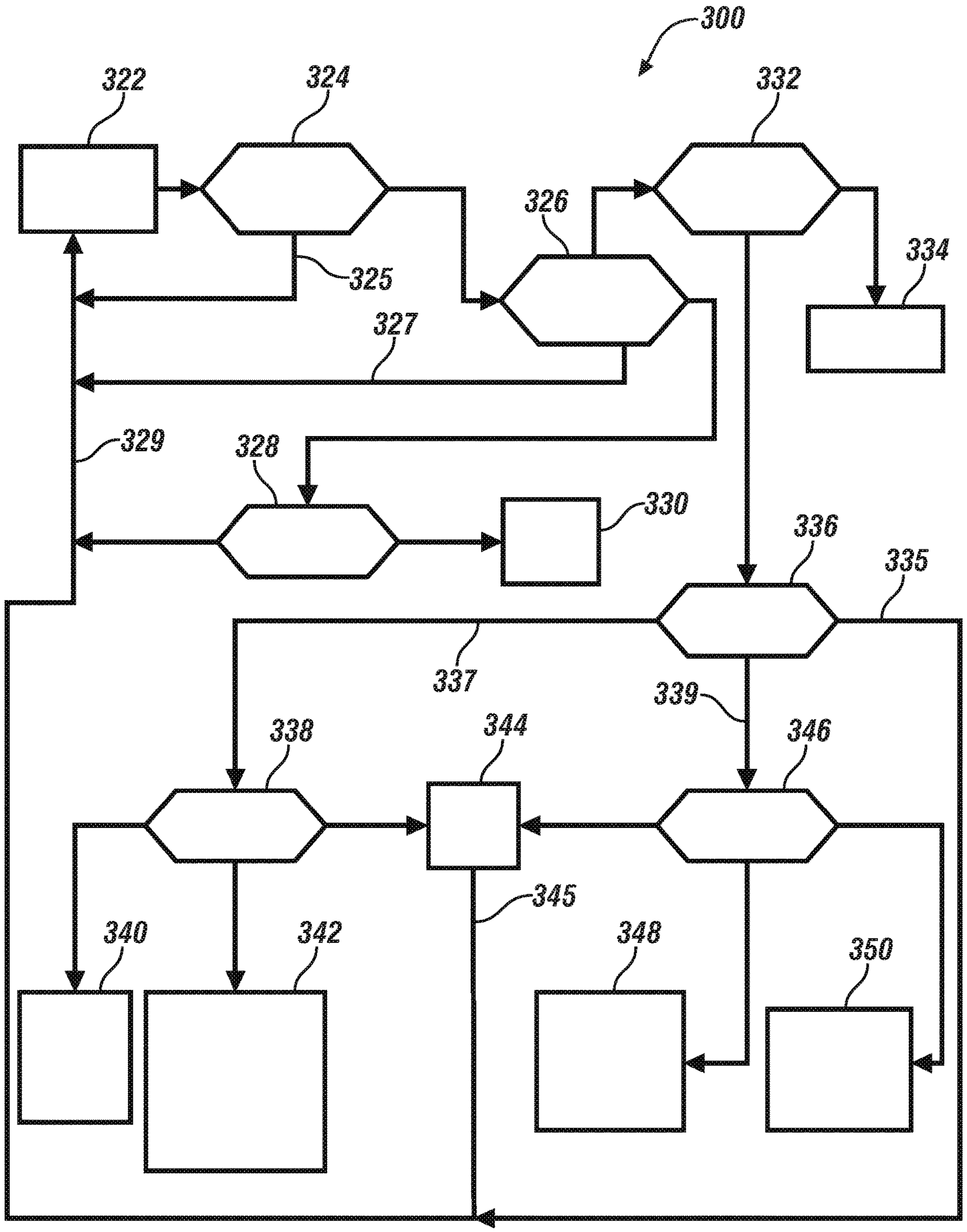
FIG. 3 is a flowchart depicting an example method of generating sound within the vehicle in accordance with an embodiment.

FIG. 3 is a flowchart depicting an example method 300 of detecting selected operational conditions in the vehicle and generating sounds in the vehicle, in particularly pop and burble sounds. The method 300 begins at process 322 with the collection of various signals from the vehicle. In an embodiment the various signals utilized by the audio control module 200 may be collected by the engine control module 114 and transmitted to the audio control module 200 as described herein. In other embodiments signals may also be collected and distributed by various other modules or functions in the system. In an embodiment, the method 300 includes determining whether a driver selected mode is in the aggressive mode (sport/track) as depicted at decision block 324. At a given time, the driver selected mode may be one of, for example, sport/track, normal, touring, economy, and the like. The driver selected mode may be set, for example, based on user input to one or more user input devices. In an embodiment, if the vehicle system 100 is in any mode other than the sport/track mode, the process returns to the beginning at process block 322 as depicted on line 325. If it is determined at decision block 324 that the sport/track mode is selected, the method 300 moves to decision block 326 to determine the state of the engine 102. In an embodiment, if the engine 102 is determined to be "OFF" the method returns to the beginning at process block 322 as depicted on line 327. If it is determined at decision block 326 that the engine 102 is in a start mode, the method 300 transitions to decision block 328 to determine if a key start is in process or an autostart, if an autostart is selected, the method 300 returns to the beginning at process block 322 as depicted on line 329. If at autostart decision block 328 it is determined that a key start is under way, then the method 300 moves to function 330 of the audio control module 200 to provide a "Start-Up Flare" that is indicated by one or two maximum level pops and no burble played on the initial detection of the negative going engine speed. Returning to decision block 326, if the engine state is determined to be "ON" the method 300 continues to decision block 332 to determine the state of the drive train and whether the vehicle is in a drive gear or in neutral/park. If it is determined at decision block 332 the vehicle is in neutral/park then the method 300 moves to function 334 of the audio control module 200 to provide audio for a "Neutral Free Rev", which is evidenced by maximum level continuous pops an burbles through the duration of the engine RPM rundown. Alternately, if it is determined at decision block 332 that the vehicle is in a gear, then the method 300 transitions to decision block 336 to ascertain whether the engine speed is within selected ranges. If the engine speed is less than a first selected threshold, there is no need to generate any pops and burbles, and as a result, the method 300 returns to the beginning at process block 322 as depicted on line 335. If the engine speed is in a lower selected range, the method 300 continues to shift direction decision block 338 to ascertain a direction of a gear shift of the vehicle transmission. It should be appreciated that in an embodiment while particular engine speed values and ranges are identified, these values are merely illustrative. Various thresholds, limits, or ranges for the engine speed thresholds and ranges are possible and within the scope of this disclosure. At decision block 338 three possible shifting scenarios are addressed, downshift, upshift or no shift at all. If at decision block 338 it is determined that the transmission shift is in a negative direction (i.e., a downshift) then the method 300 moves to function 340 of the audio control module 200 to provide audio for a "Rev Match Downshift", which is evidenced by one or two mild burbles played at the shift point. If however, the decision block 338 identifies that no shift is taking place, then the method 300 moves to function 342 of the audio control module 200 to provide audio for a "Closed Throttle Decel For Drive (Automatic)", which is evidence by mild burbles played through the rpm range. Finally, if at the decision block 338 it is ascertained that the direction of the shift is positive (i.e., upshift) then no pop and burble is played as depicted at block 344 and the process 300 reiterates and transitions to block 322 as depicted by line 345.

Similarly, returning to engine speed decision block 336, if the engine speed is in an upper selected range, the method 300 continues to shift direction decision block 346 to ascertain a direction of a gear shift of the vehicle transmission. Again, at decision block 346 three possible shifting scenarios are addressed downshift, upshift or no shift at all. If at decision block 346 it is determined that the transmission shift is in a negative direction (i.e., a downshift) then the method 300 moves to function 344 and no pop and burble is played and the process transitions to block 322 to reiterates as depicted by line 345. If however, the decision block 346 identifies that no shift is taking place, then the method 300 moves to function 348 of the audio control module 200 to provide audio for a "Closed Throttle Decel For Fixed Gear (manual)", which is evidenced by mild burbles played throughout the engine speed range. Finally, if at the decision block 346 it is ascertained that the direction of the shift is positive (i.e., upshift) that the process 300 moves to function 350 of the audio control module 200 to provide audio for a "Fuel Cut on Wide Open Throttle (WOT) Shift Points", which is evidenced by a single loud pop/whoosh applied at the shift points.

Figure 4:
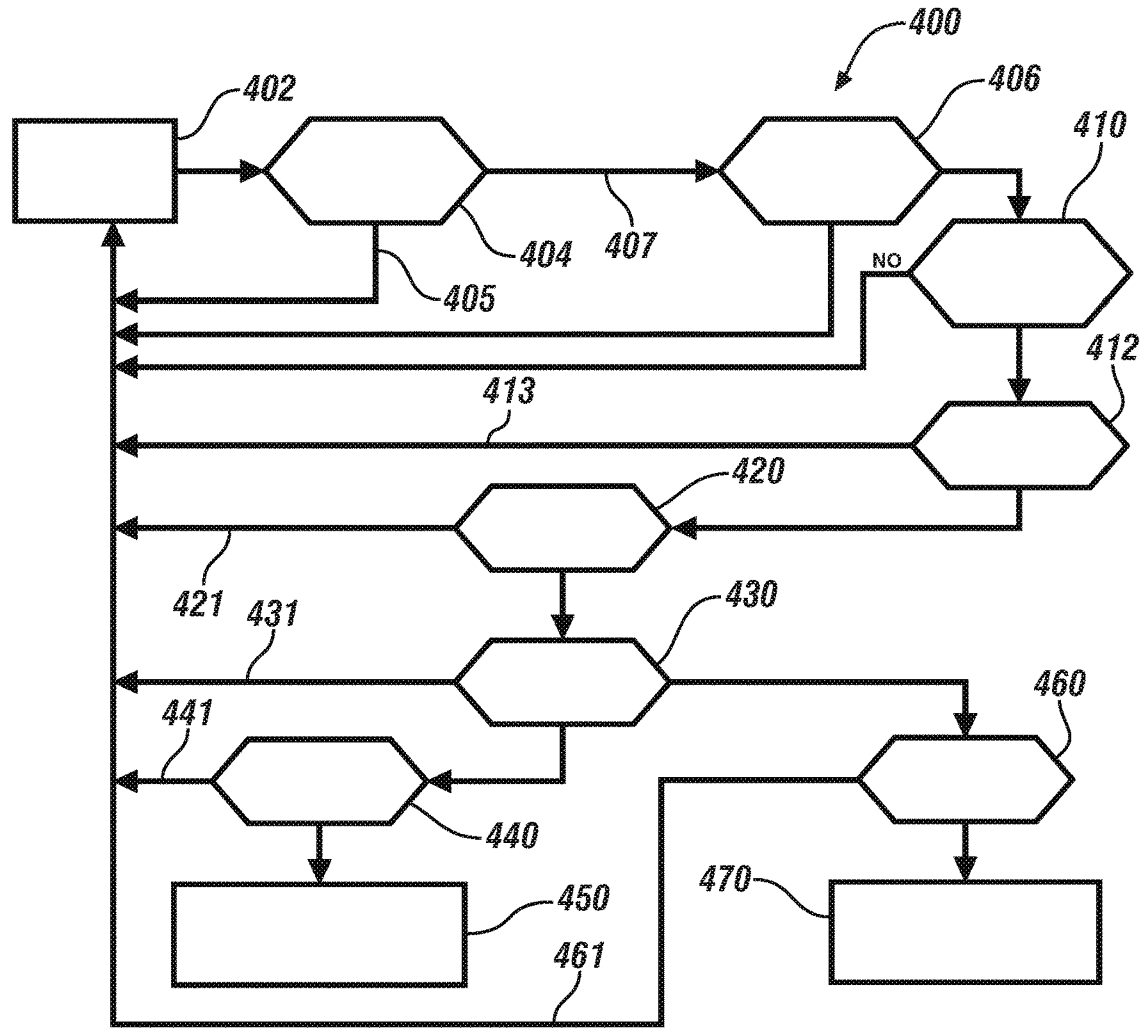
FIG. 4 is a flowchart depicting an example method of generating sound within the vehicle in accordance with an embodiment.

FIG. 4 is a flowchart depicting an example method 400 of detecting selected operational conditions in the vehicle and generating sounds in the vehicle, in particularly pop and burble sounds. The method 400 initiates in a similar manner to method 300 with determining various states in the vehicle. In this embodiment, the method 400 begins at process 402 with the collection of various signals from the vehicle. In an embodiment, the various signals utilized by the audio control module 200 may be collected by the engine control module 114 and transmitted to the audio control module 200 as described herein. In other embodiments, signals may also be collected and distributed by various other modules in the system. In an embodiment, the method 400 includes determining whether a driver selected mode is in the aggressive mode (sport/track) as depicted at decision block 404, similar to that described for process 324 (FIG. 3). Once again, if the vehicle system 100 is in any mode other than the sport/track mode, the process returns to the beginning at process block 402 as depicted on line 405. If it is determined at decision block 404 that the sport/track driver mode is selected, the method 400 moves to decision block 406 to determine the state of the engine 102.

In an embodiment, if the engine 102 is determined to be "OFF" the method 400 once again returns to the beginning at process block 402 as shown by line 407. If it is determined at decision block 406, that engine state is "ON" the method 400 continues to decision block 410 to determine the state of the drive train and whether the vehicle is in a drive gear or in neutral/park. If it is determined at decision block 410 the vehicle is in neutral/park then the method 400 transitions to block 402 to reiterate. Alternately, if it is determined at decision block 410 that the vehicle is in a gear, then the method 400 transitions to decision block 412 to ascertain whether the vehicle speed equals or exceeds a selected threshold. In this embodiment, the threshold is 30 mph, but other thresholds are possible. The vehicle speed may be determined based on one or more wheel speeds of the vehicle measured using wheel speed sensor(s), respectively. For example, the ECM 114 may determine the vehicle speed based on an average of two or more of the wheel speeds. It should be appreciated that in an embodiment while particular vehicle speed of 30 mph is identified, such a threshold value is merely illustrative. Various thresholds and limits or ranges for the vehicle speed are possible and within the scope of this disclosure. The audio control module 200 may receive the vehicle speed, for example, via the network. In some embodiments, vehicle speed may be determined from other sensors, for example, using GPS data or inferred from other vehicle sensors and equipment (e.g., transmission or drive train).

If the vehicle speed is less than the selected threshold, once again the method 400 transitions to block 402 to reiterate as depicted by line 413. If at decision block 412 it is determined that the vehicle speed equals or exceeds a selected threshold, then the method 400 transitions to decision block 420 to ascertain if the engine speed is within selected ranges. If the engine speed is in a lower selected range, the method 400 continues following line 421 to return to block 402 and reiterate. If it is determined at engine speed decision block 420, that the engine speed is in an upper selected range, the method 400 continues to direction of shift decision block 430. If at decision block 430 it is ascertained that the direction of the shift is positive (i.e., upshift) then the method 400 transitions to pedal decision block 460 to ascertain if the driver is making a large input to the accelerator pedal in the vehicle. If the driver's foot is not making a large input, in excess of a selected threshold, (e.g., pedal at "<80%") then the process 400 transitions to block 402 to reiterate as depicted by line 461. If the pedal position exceeds a selected threshold, (in this embodiment ≥80%), then the method 400 transitions to function block 470 and the audio control module 200 provides audio for a "Fuel Cut on WOT Shift Point". In this embodiment, the audio control module 200 is configured to provide a single loud pop/whoosh in each shift instance. It should be appreciated that, in an embodiment, while particular pedal position of 0% and 80% are identified, these values are merely illustrative. Various thresholds and limits or ranges for the pedal position are possible and within the scope of this disclosure.

Returning to direction of shift decision block 430, if at decision block 430 it is ascertained that no shift is taking place then the method 400 transitions pedal decision block 440 to ascertain if the driver is making a no input to the accelerator pedal in the vehicle. If the driver is making no input to the accelerator pedal (e.g., at "0") then the process 400 transitions to function block 450 and the audio control module 200 provides audio for a "Closed Throttle Decel in fixed Gear (manual)". In this embodiment, the audio control module 200 is configured to provide mild burbles through the event speed range of the engine 102. Continuing with decision block 440, if the driver is making any other input to the accelerator pedal (e.g., pedal >0), then the process 400 transitions to block 402 to reiterate as depicted by line 441. Finally, if at direction of shift decision block 430 it is ascertained that a downshift (e.g., negative direction) is taking place then the process 400 transitions to block 402 to reiterate as depicted by line 431.

Figure 5:
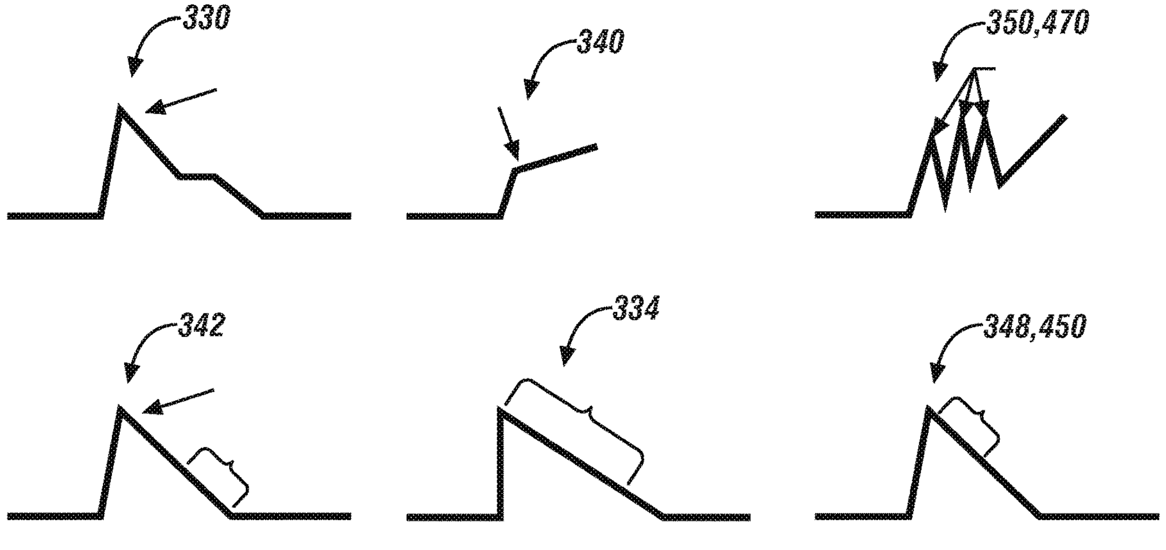
FIG. 5 is a set of diagrams depicting the application of pop and burble under selected operating conditions in accordance with an embodiment.

Table 1 depicts six example conditions for application of pop and burble sounds associated with various driving modes, states conditions, events, and the like. The table depicts the detection conditions, the conditions for application of pops and burbles and the kinds of sounds and conditions for the application associated with the function blocks as identified in FIGS. 3 and 4. Likewise, FIG. 5 depicts a graphical depiction associated with the six example conditions for application of the pops and burble associated with the methods and process functions of FIGS. 3 and 4 as well as Table 1. The brackets and arrows identify pictorially the application and durations of sounds as identified for each of the conditions or events in Table 1.

TABLE 1

| Event | Detection Conditions | Conditions to Apply Pop and Burble | What Pop and Burble to apply |
|---|---|---|---|
| Start-up Flare Event | Driver Mode = Agg (Track) & Eng State = Starting & EngAutostop = False | If: Veh Spd = 0 & Pedal = 0 & Delta RPM is "—" and RPM = >1500 | 1-2 Maximum Level Pops & No Burble on initial detection of negative RPM |
| Neutral Free Rev Event | If: Driver Mode = Aggressive & Eng State = On & Gear State = Neutral/Park | If: Veh Spd = 0 & Pedal = 0 & Delta RPM is "—" and RPM = >3000* | Maximum Level Continuous Pops & Burbles through duration of negative RPM slope |
| Closed Throttle Decel in fixed gear (Manual) Event | If: Driver Mode = Aggressive & Eng State = On & Gear State = Forward Drive Mode & Shift Flag = Not True | If: Veh Spd >30 & Pedal = 0 & Delta RPM is "—" and 4500< RPM >9000* | Mild Burbles through event RPM range |
| Closed Throttle Decel in Drive (Automatic) Event | If: Driver Mode = Aggressive & Eng State = On & Gear State = Forward Drive Mode & Shift Flag = Not True | If: Veh Spd >30 & Pedal = 0 & Delta RPM is "—" and 2000< RPM >4500* | Mild Burbles through event RPM range |
| Rev Match downshift | If: Driver Mode = Aggressive & Eng State = On & Gear State = Forward Drive Mode & DownShift Flag = True | If: Veh Spd >30 & Delta RPM is "—" and RPM = >3000* | 1-2 Mild Burbles |
| Fuel Cut on WOT shift points | If: Driver Mode = Aggressive & Eng State = On & Gear State = Forward Drive Mode & UpShift Flag = True | If: Veh Spd >40 & Pedal >80% & Delta RPM is "0" and RPM = >3000* | A single Loud Pop/Whoosh |

*RPM is a calibratable number

Figure 6:
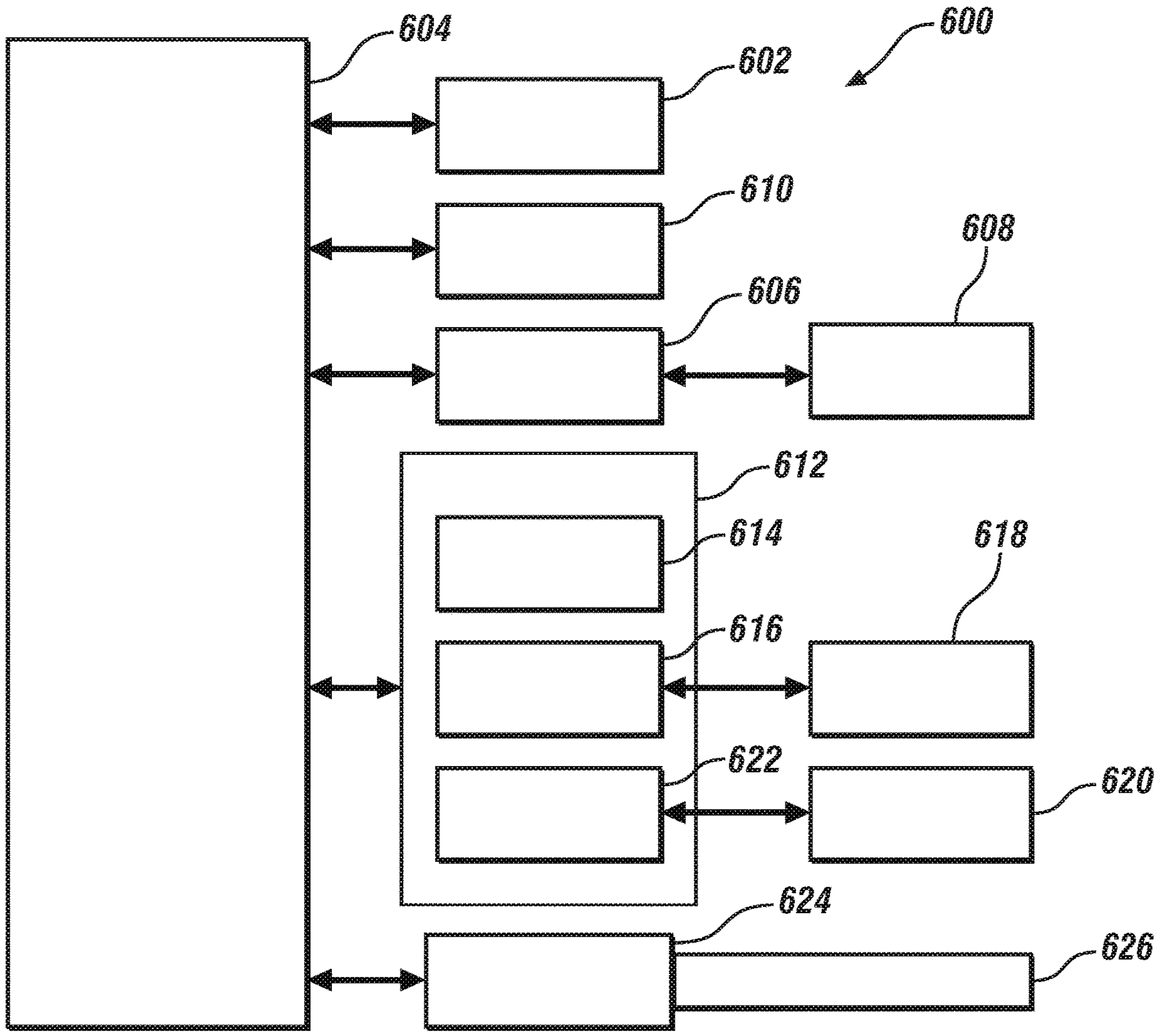
FIG. 6 depicts an example block diagram of a computing system in accordance with an embodiment.

FIG. 6 depicts a high-level block diagram of a computing system 600, which can be used to implement one or more embodiments. Computing system 600 can correspond to, at least, a system that is configured to operate on the motor vehicle including ECM 114 and audio control module 200, for example. Computing system 600 can correspond to an interface device, a conversion device, and/or a network simulation device. Computing system 600 can be used to implement hardware components of systems capable of performing methods described herein. Although one exemplary computing system 600 is shown, computing system 600 includes a communication path 626, which connects computing system 600 to additional systems (not depicted). Computing system 600 and additional system are in communication via communication path 626, (e.g., to communicate data between them).

Computing system 600 includes one or more processors, such as processor 602. Processor 602 is connected to a communication infrastructure 604 (e.g., a communications bus, cross-over bar, or network). Computing system 600 can include a display interface 606 that forwards graphics, textual content, and other data from communication infrastructure 604 (or from a frame buffer not shown) for display on a display unit 608. Computing system 600 also includes a main memory 610, preferably random access memory (RAM), and can also include a secondary memory 612. There also can be one or more disk drives 614 contained within secondary memory 612. Removable storage drive 616 reads from and/or writes to a removable storage unit 618. As will be appreciated, removable storage unit 618 includes a computer-readable medium having stored therein computer software and/or data. In alternative embodiments, secondary memory 612 can include other similar memory and communications for allowing computer programs or other instructions to be loaded into the computing system 600. Such secondary memory can include, for example, a removable storage unit 620 and an interface 622.

In the present description, the terms "computer program medium," "computer usable medium," and "computer-readable medium" are used to refer to media such as main memory 610 and secondary memory 612, removable storage drive 616, and a disk installed in disk drive 614. Computer programs (also called computer control logic) are stored in main memory 610 and/or secondary memory 612. Computer programs also can be received via communications interface 624. Such computer programs, when run, enable the computing system 600 to perform the features discussed herein. In particular, the computer programs, when run, enable processor 602 to perform the features of the computing system 600. Accordingly, such computer programs represent controllers of the computing system 600. Thus, it can be seen from the forgoing detailed description that one or more embodiments provide technical benefits and advantages.

In this application, including the definitions below, the term "controller" may be replaced with the term "circuit," "processor," and the like. Likewise the term "module" can be replaced or interchangeable with "function", process" and the like. The term "module" or "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip. The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. The computer programs may include: (i) descriptive text to be parsed, such as HTML (hypertext markup language), XML (extensible markup language), or JSON (JavaScript Object Notation); (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. A method of controlling audio within a vehicle, comprising:

determining a selectable driving mode;

ascertaining an operating state of an engine in the vehicle;

identifying at least one of an auto start status and drive-train status of the vehicle;

in response to the determining, ascertaining, and identifying, selecting a predetermined sound based on at least one of a pop and a burble, to be output within a passenger cabin of the vehicle; and applying a signal to a speaker of the passenger cabin of the vehicle based on the predetermined sound.

2. The method of claim 1, wherein the predetermined sound is at least one of a start-up flare and a neutral free rev.

3. The method of claim 1, wherein the predetermined sound is the start-up flare if the auto start status is key start and the predetermined sound is the neutral free rev if the drive train status is in park/neutral.

4. The method of claim 1 further comprising:

determining at least one of: whether a vehicle speed exceeds a selected vehicle speed threshold and whether an engine speed is within at least one of a selected upper engine speed range and a selected first or second lower engine speed range;

ascertaining a direction of shifting of a transmission in the vehicle;

in response to at least one of the determining and ascertaining, selecting a predetermined sound to be output within a passenger cabin of the vehicle; and applying a signal to a speaker of the passenger cabin of the vehicle based on the predetermined sound.

5. The method of claim 4, wherein if the engine speed is in the selected upper engine speed range, and, if the direction of shift is an up shift, then the predetermined sound is a fuel cut on wide open throttle, otherwise, if the direction of shift is ascertained to be no shift, then the predetermined sound is a closed throttle deceleration in fixed gear, otherwise, if the direction of shift is a down shift, then no predetermined sound is played.

6. The method of claim 4, wherein if the engine speed is in the first selected lower engine speed range, and, if the direction of shift is an down shift, then the predetermined sound is a rev match down shift, otherwise, if the direction of shift is ascertained to be no shift, then the predetermined sound is a closed throttle deceleration for a selected speed range, otherwise, if the direction of shift is up shift, then no predetermined sound is played.

7. The method of claim 4, wherein if the engine speed is in the selected upper engine speed range and it is determined that the driver input to the accelerator pedal exceeds about a selected threshold:

and if it is determined that the direction of shift is ascertained to be an upshift, then the predetermined sound is a fuel cut on wide open throttle shift points for the upper selected speed range, otherwise, if it is determined that the direction of shift is ascertained to be an no shift, then the predetermined sound is a closed throttle deceleration in fixed gear for manual transmission, otherwise, if it is determined that the driver is not applying input to an accelerator pedal or the direction of shift is ascertained to be a downshift, then no predetermined sound is played.

8. The method of claim 4, wherein if the engine speed is in the second selected lower engine speed range, then no predetermined sound is played.

9. The method of claim 4, wherein the selected vehicle speed threshold is thirty miles per hour.

10. The method of claim 4, wherein the upper selected engine speed range is about 4500-9000 rpm, the first lower selected engine speed range is about 3000-4500 rpm, and the second lower selected engine speed range is about 1500-3000 rpm.

11. The method of claim 1, further comprising:

identifying a sound generated by a vehicle;

classifying a type of the sound as one of:

a first type of the sound; and a second type of the sound;

selecting a first predetermined sound as the predetermined sound when the type of the sound is the first type of the sound; and selecting a second predetermined sound as the predetermined sound when the type of the sound is the second type of the sound.

12. The method of claim 11, wherein the classifying includes classifying the sound is based on at least one of the pressure measured by the exhaust pressure sensor, a rate of increase (ROI) of the pressure measured by the exhaust pressure sensor, the duration of a pop. average pop loudness, and average pop duration, normal level burbles and mild level burbles.

13. An audio system of a vehicle having an engine and a drive train, the audio system operable to:

determine a selectable driving mode;

ascertain an operating state of an engine in the vehicle;

identify least one of an auto start status and a drivetrain status of the vehicle;

in response to the determining, ascertaining, and identifying, select a predetermined sound based on at least one of a pop and a burble, to be output within a passenger cabin of the vehicle; and apply a signal to a speaker of the passenger cabin of the vehicle based on the predetermined sound.

14. The audio system of claim 13, wherein the predetermined sound is at least one of a start-up flare and a neutral free rev.

15. The audio system of claim 14, wherein the predetermined sound is the start-up flare if the auto start status is key start and the predetermined sound is the neutral free rev if the drive train status in park/neutral.

16. The audio system of claim 13 further comprising the audio controller configured to:

determine at least one of whether a vehicle speed exceeds a selected vehicle speed threshold and whether an engine speed is within at least one of a selected upper engine speed range and a selected first or second lower engine speed range;

ascertain a direction of shifting of a transmission in the vehicle;

in response to at least one of the determining and ascertaining, select a predetermined sound to be output within a passenger cabin of the vehicle; and apply a signal to a speaker of the passenger cabin of the vehicle based on the predetermined sound.

17. The audio system of claim 16, wherein if the engine speed is in the selected upper engine speed range and, if the direction of shift is an up shift, then the predetermined sound is a fuel cut on wide open throttle, otherwise, if the direction of shift is ascertained to be no shift, then the predetermined sound is a closed throttle deceleration in fixed gear, otherwise, if the direction of shift is a down shift, then no predetermined sound is played.

18. The audio system of claim 16 wherein if the engine speed is in the first selected lower engine speed range and, if the direction of shift is an down shift, then the predetermined sound is a rev match down shift, otherwise, if the direction of shift is ascertained to be no shift, then the predetermined sound is a closed throttle deceleration for a selected speed range, otherwise, if the direction of shift is up shift, then no predetermined sound is played.

19. The audio system of claim 16, wherein if the engine speed is in the selected upper engine speed range and it is determined that the driver input to the accelerator pedal exceeds about a selected threshold, and if it is determined that the direction of shift is ascertained to be an upshift, then the predetermined sound is a fuel cut on wide open throttle shift points for the upper selected speed range, otherwise, if it is determined that the direction of shift is ascertained to be an no shift, then the predetermined sound is a closed throttle deceleration in fixed gear for manual transmission, otherwise, if it is determined that the driver is not applying input to an accelerator pedal or the direction of shift is ascertained to be a downshift, then no predetermined sound is played.

20. The audio system of claim 16, wherein if the engine speed is in the second selected lower engine speed range, then no predetermined sound is played.

* * * * *